US012612699B2

(12) United States Patent
Zhang et al.

(10) Patent No.: US 12,612,699 B2
(45) Date of Patent: Apr. 28, 2026

(54) BINDING AGENT FOR GRAPHENE FILM TRANSFER AND TRANSFER METHOD OF GRAPHENE FILM

(71) Applicants: NINGBO SOFTCARBON ELECTRONIC TECHNOLOGY CO., LTD., Ningbo (CN); NINGBO INSTITUTE OF MATERIALS TECHNOLOGY AND ENGINEERING, CHINESE ACADEMY OF SCIENCES, Ningbo (CN)

(72) Inventors: Fangjun Zhang, Ningbo (CN); Jiaoxia Wang, Ningbo (CN); Wei Wang, Ningbo (CN); Li Chen, Ningbo (CN); Shufen Lu, Ningbo (CN); Zhaoping Liu, Ningbo (CN)

(73) Assignees: NINGBO SOFTCARBON ELECTRONIC TECHNOLOGY CO., LTD., Ningbo (CN); NINGBO INSTITUTE OF MATERIALS TECHNOLOGY AND ENGINEERING, CHINESE ACADEMY OF SCIENCES, Ningbo (CN)

( * ) Notice: Subject to any disclaimer, the term of this patent is extended or adjusted under 35 U.S.C. 154(b) by 555 days.

(21) Appl. No.: 17/928,643

(22) PCT Filed: Jun. 10, 2022

(86) PCT No.: PCT/CN2022/098064
§ 371 (c)(1),
(2) Date: Nov. 30, 2022

(87) PCT Pub. No.: WO2023/216354
PCT Pub. Date: Nov. 16, 2023

(65) Prior Publication Data
US 2024/0218516 A1      Jul. 4, 2024

(30) Foreign Application Priority Data

May 13, 2022    (CN) .......................... 202210520375.5

(51) Int. Cl.
*C23C 16/56* (2006.01)
*C01B 32/186* (2017.01)
(Continued)

(52) U.S. Cl.
CPC ............ *C23C 16/56* (2013.01); *C01B 32/186* (2017.08); *C01B 32/194* (2017.08); *C23C 16/26* (2013.01); *C23F 1/00* (2013.01)

(58) Field of Classification Search
None
See application file for complete search history.

(56) References Cited

U.S. PATENT DOCUMENTS

2013/0065034 A1    3/2013   Muramatsu
2014/0010501 A1    1/2014   Saito et al.
(Continued)

FOREIGN PATENT DOCUMENTS

CN           102616769 A  *  8/2012
CN           103342472 A     10/2013
(Continued)

OTHER PUBLICATIONS

The Japanese 1st Office Action for JP2022-574279, mailed Oct. 22, 2024.
(Continued)

*Primary Examiner* — Stephanie P Duclair
(74) *Attorney, Agent, or Firm* — Yue (Robert) Xu; Apex Attorneys at Law, LLP

(57) ABSTRACT

The present disclosure provides a binding agent for graphene film transfer, comprising 5-95 parts by weight of a volatile organic solvent A and 95-5 parts by weight of a
(Continued)

volatile organic solvent B. The present disclosure does not use a transition substrate, which greatly reduces the cost, and realizes low-cost transfer. Moreover, the binding agent can be completely volatilized, so that the transferred graphene has no residual glue. The graphene is pure and pollution-free, and a high-quality graphene film can be obtained after the transfer of the graphene. Furthermore, high-quality multi-layer transfer can be achieved and the quality of multi-layer graphene can be guaranteed. Moreover, the graphene can be transferred to any different target substrates. The transfer method provided by the present disclosure has simple operation, good controllability and high repeatability, which can not only realize single-piece transfer, but also can realize roll-to-roll large-area transfer, and can maintain the high quality of graphene after the transfer, so that it is especially suitable for promotion and application of large-scale preparation and production.

3 Claims, 1 Drawing Sheet

(51) Int. Cl.
C01B 32/194 (2017.01)
C23C 16/26 (2006.01)
C23F 1/00 (2006.01)

(56) References Cited

U.S. PATENT DOCUMENTS

| | | | |
|---|---|---|---|
| 2017/0298504 A1 | 10/2017 | Heise et al. | |
| 2018/0230379 A1 | 8/2018 | Zhang et al. | |
| 2020/0308005 A1* | 10/2020 | Arliguie | B05D 3/12 |

FOREIGN PATENT DOCUMENTS

| | | | |
|---|---|---|---|
| CN | 104477894 A | | 4/2015 |
| CN | 105239061 A | | 1/2016 |
| CN | 105907180 A | | 8/2016 |
| CN | 106435727 A | | 2/2017 |
| CN | 106519992 A | | 3/2017 |
| CN | 107311158 A | | 11/2017 |
| CN | 107364851 A | | 11/2017 |
| CN | 107619386 A | | 1/2018 |
| CN | 108285142 A | | 7/2018 |
| CN | 109879277 A | | 6/2019 |
| CN | 110203915 A | | 9/2019 |
| CN | 113023718 A | | 6/2021 |
| CN | 113264522 A | | 8/2021 |
| CN | 114180562 A | | 3/2022 |
| CN | 114408905 A | | 4/2022 |
| JP | 2015229618 | * | 12/2015 |
| JP | 2015229618 A | | 12/2015 |
| JP | 2016212447 A | | 12/2016 |
| JP | 2018532686 A | | 11/2018 |
| JP | 2019511451 A | | 4/2019 |
| KR | 20170013557 A | | 2/2017 |
| WO | 2012108371 A1 | | 8/2012 |
| WO | 2015197217 A1 | | 12/2015 |
| WO | 2018133053 A1 | | 7/2018 |

OTHER PUBLICATIONS

International Search Report and Written Opinion of the International Searching Authority for PCT/CN2022/098064, mailed Nov. 30, 2022.
The 1st Office Action dated May 9, 2025 for the Chinese Patent Application No. CN202210520375.5. English Translation of the 1st Office Action Provided by http://globaldossier.uspto.gov.
The 2nd Office Action dated Feb. 28, 2026 for the Chinese Patent Application No. CN202210520375.5. English Translation of the 2nd Office Action Provided by http://globaldossier.uspto.gov.

* cited by examiner

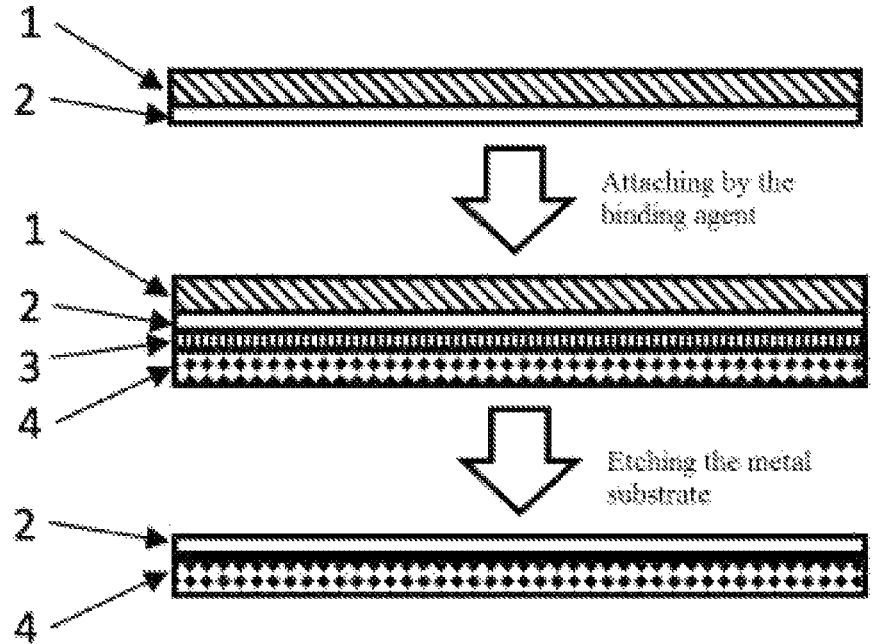

BINDING AGENT FOR GRAPHENE FILM TRANSFER AND TRANSFER METHOD OF GRAPHENE FILM

CROSS REFERENCE TO RELATED APPLICATIONS

This application is the national phase of International Application No. PCT/CN2022/098064, titled "BINDING AGENT FOR GRAPHENE FILM TRANSFER AND TRANSFER METHOD OF GRAPHENE FILM", filed on Jun. 10, 2022, which claims the priority to Chinese Patent Application No. 202210520375.5, titled "BINDING AGENT FOR GRAPHENE FILM TRANSFER AND TRANSFER METHOD OF GRAPHENE FILM", filed on May 13, 2022 with the China National Intellectual Property Administration, which is incorporated herein by reference in entirety.

FIELD

The present disclosure relates to the field of graphene film transfer, and in particular to a binding agent for graphene film transfer and a transfer method of graphene film.

BACKGROUND

At present, large-area graphene is mainly grown on metal substrate (such as copper foil, nickel foil, etc.) by CVD method. How to transfer graphene from a metal substrate to any substrate is the key to whether graphene film can be widely used. Conventional processes can be divided into the following categories in terms of transfer methods:

The first is to use the transition substrate method. The transition substrate mainly comprises: heat release tape, PMMA, silica gel, etc. The specific process is as follows: attaching a transition substrate to a metal substrate with a graphene surface to form a transition substrate/graphene/metal substrate structure, and removing the metal substrate by a corresponding method (the method comprises: chemical etching method, electrochemical bubbling method, etc.), attaching the remaining transition substrate/graphene structure to a target substrate to form a transition substrate/graphene/target substrate structure, and finally, removing the transition substrate by a corresponding method, which mainly comprises heat release method, organic solvent dissolution method, other physical methods and so on.

The second is to use a binding agent method. A target substrate is attached to a metal substrate with graphene by using a binding agent to form a target substrate/binding agent/graphene/metal substrate structure. The metal substrate is removed by a corresponding method (the method comprises: chemical etching method, electrochemical bubbling method, etc.) to obtain target substrate/binding agent/ graphene.

However, the existing transfer methods still have the following problems:

First: it is of high cost. During the use of the transition substrate, the cost of the transition substrate is inevitably increased. For example, a high-cost heat release tape is introduced. The introduction of other types of transition substrate, such as silicone membranes, also increases the cost.

Second: it is not easy to operate, not suitable for large-area transfer, especially roll-to-roll transfer. For example, in the process of using PMMA, it is necessary to be very careful to operate, and large-area transfer is prone to damage.

Third: the integrity of graphene cannot be guaranteed. Graphene is easily damaged during the back and forth transfer process by using a transition substrate, and it cannot be guaranteed that graphene will not be damaged during the graphene transfer process. In layman's terms, the more transfer processes are, the more likely it is to occur damage.

Fourth: the cleanliness of the transferred graphene cannot be maintained. The specific performance is that the transition substrate cannot be completely removed.

Fifth: the physical properties such as light transmittance and the like can be affected by using conventional binding agents. The transfer of graphene to the substrate will leave a thin layer of binding agent between the substrate and graphene, which will affect the light transmittance and electrical conductivity of the graphene film product and severely limit the scope of application of the graphene product.

Sixth: multi-layer transfer cannot be performed by using conventional binding agents.

Using conventional binding agents in multi-layer transfer of graphene will leave a thin layer of binding agent between the two layers of graphene, which loses the meaning of transferring multi-layer graphene.

Therefore, how to find a more suitable graphene film transfer method to solve the above problems existing in the current graphene film transfer has become one of the urgent problems to be solved by many forward-looking front-line researchers.

SUMMARY

In view of this, the technical problem to be solved by the present disclosure is to provide a binding agent for graphene film transfer and a transfer method of graphene film. This binding agent with specific composition used in the graphene transfer process can achieve the low-cost and non-destructive transfer of graphene to any target substrate. In conjunction with the roll-to-roll growth process, large-scale preparation and production can be achieved, and meanwhile, the purpose of reducing the sheet resistance of graphene through multiple transfers of graphene can be achieved.

The present disclosure provides a binding agent for graphene film transfer, comprising:

5-95 parts by weight of volatile organic solvent A;

95-5 parts by weight of volatile organic solvent B;

The volatile organic solvent A comprises one or more of halogenated hydrocarbon solvent, aromatic hydrocarbon solvent, aliphatic hydrocarbon solvent and alicyclic hydrocarbon solvent;

The volatile organic solvent B comprises one or more of alcohol solvent, ester solvent, ether solvent, ketone solvent, phenol and petroleum ether.

Preferably, the volatile solvent comprises organic solvent insoluble and/or slightly soluble in water;

The graphene comprises a graphene layer or a graphene film;

The transfer is specifically transferring the graphene film from a growth substrate to a target substrate;

During the transfer process, the binding agent is located between the graphene film and the target substrate.

Preferably, the growth substrate comprises metal substrate;

A method of the growth comprises chemical vapor deposition;

The transfer process comprises a step of laminating the graphene film, the binding agent and the target substrate;

The binding agent located between the graphene film and the target substrate is specifically an organic solvent liquid film.

Preferably, the metal substrate comprises one or more of copper foil, nickel foil and copper-nickel alloy;

The target substrate comprises one or more of plastic substrate, common glass substrate, quartz substrate, silicon wafer substrate and metal substrate.

Preferably, the halogenated hydrocarbon solvent comprises one or more of chloroform, trichloroethane, tetrachloroethane, tetrachloroethylene and pentachloroethane;

The aromatic hydrocarbon solvent comprises one or more of benzene, toluene, xylene and ethylbenzene;

The aliphatic hydrocarbon solvent comprises pentane and/or hexane;

The alicyclic hydrocarbon solvent comprises one or more of cyclohexane, cyclohexanone and methylcyclohexane.

Preferably, the alcoholic solvent comprises octanol and/or hexanol;

The ester solvent comprises one or more of ethyl acetate, methyl acetate, dimethyl carbonate and butyl acetate;

The ether solvent comprises one or more of ether, n-propyl ether and anisole;

The ketone solvent comprises one or more of methyl isobutyl ketone, propiophenone and methyl ethyl ketone.

Preferably, the volatile solvent has a boiling point of 50-250° C.;

The volatile solvent comprises one or more of tetrachloroethane, tetrachloroethylene, pentachloroethane, toluene, pentane, ethyl acetate, dimethyl carbonate, methyl isobutyl ketone, phenol and petroleum ether.

The present disclosure also provides a method of transferring graphene film, comprising the following steps:

1) Growing graphene on a metal substrate to obtain a metal substrate/graphene structural material;

2) Placing a volatile organic solvent binding agent between the graphene surface in the metal substrate/graphene structural material obtained in the above step and a target substrate, and then laminating to obtain a metal substrate/graphene/liquid film/target substrate structural material;

The volatile organic solvent binding agent comprises the binding agents for graphene film transfer described in any one of the above technical solutions;

3) Placing the metal substrate/graphene/liquid film/target substrate structural material of the above step into an etching solution, and then etching and removing the metal substrate to obtain a graphene/liquid film/target substrate structure;

4) In one or more steps of the etching process, during the process of taking out from the etching solution, and after taking out from the etching solution, volatilizing the liquid film of the graphene/liquid film/target substrate structure obtained in the above step to obtain a graphene/target substrate structural material.

Preferably, a method of the placing comprises placing the graphene surface in the metal substrate/graphene structural material and the target substrate into a volatile solvent binding agent;

A method of the laminating comprises roll lamination and/or plate lamination.

Preferably, a pressure of the laminating is 0.01-1 MPa;

A laminating speed of the roll lamination is 0.1-2 m/min;

A duration of the laminating is 1-5 s.

The present disclosure provides a binding agent for graphene film transfer, comprising 5-95 parts by weight of a volatile organic solvent A and 95-5 parts by weight of a volatile organic solvent B; the volatile organic solvent A comprises one or more of halogenated hydrocarbon solvent, aromatic hydrocarbon solvent, aliphatic hydrocarbon solvent and alicyclic hydrocarbon solvent; the volatile organic solvent B comprises one or more of alcohol solvent, ester solvent, ether solvent, ketone solvent, phenol and petroleum ether. Compared with the prior art, the two-component binding agent with a specific composition provided by the present disclosure utilizes a volatile solvent insoluble or slightly soluble in aqueous solution as the binding agent. The function of this binding agent is to form a liquid film between the metal substrate/graphene and the target substrate (the binding agent is referred to as a liquid film in the following expressions). Because of the capillary force, the liquid film is able to attach the metal substrate/graphene and the target substrate together, and ensures that the metal substrate/graphene and the target substrate do not separate during the etching process. After the metal substrate is etched by the etching solution, the liquid film will be volatilized after the transfer is completed. Because of the existence of intermolecular forces, the graphene is able to be attached on the target substrate. The present disclosure, by adopting such specific combination insoluble or slightly soluble in aqueous solution, can ensure that in the aqueous etching solution, the metal substrate/graphene and target substrate will not be separated because the liquid film in the metal substrate/graphene/liquid film/target substrate structure will not be dissolved in the solution. Furthermore, the binding agent is volatile. After the metal substrate is etched, due to the volatility of the binding agent, the graphene can be firmly attached to the target substrate by intermolecular force. It can be guaranteed that there is no residual glue between the graphene and the target substrate, which represents high light transmittance of graphene to the greatest extent.

The two-component organic solvent insoluble or slightly soluble in aqueous solution provided by the present disclosure is used as a binding agent, so that the metal substrate/graphene will not be separated from the target substrate because the liquid film is not dissolved in the etching solution, which guarantees the integrity of the graphene film. Because of the volatility of the binding agent, after the metal substrate is completely etched, the binding agent can be completely volatilized, and the graphene is firmly attached to the target substrate through intermolecular forces. It can be ensured that there is no residual glue between the graphene and the target substrate, which represents the high light transmittance of graphene to the greatest extent. This graphene transfer method can be used for low-cost and non-destructive transfer of graphene to any target substrate, and in conjunction with the roll-to-roll growth process, large-scale preparation and production can be achieved, and meanwhile, the purpose of reducing the sheet resistance of graphene through multiple transfers of graphene can be achieved.

The present disclosure does not use a transition substrate, which greatly reduces the cost, and realizes low-cost transfer. Moreover, the binding agent can be completely volatilized, so the transferred graphene has no residual glue. The graphene is pure and pollution-free, so that high-quality graphene film can be obtained after the transfer of the graphene. The graphene film has high-quality characteristics such as high light transmittance, no damage, low sheet resistance, etc. Furthermore, high-quality multi-layer transfer can be achieved and the quality of multi-layer graphene can be guaranteed. Moreover, because only intermolecular force is required to achieve non-detachment, graphene can be transferred to any different target substrates, such as plastic substrate, ordinary glass substrate, quartz substrate, silicon wafer substrate, precious metal substrate, etc. In addition, the transfer method provided by the present disclosure has simple operation, good controllability and high repeatability, which can realize not only single-piece transfer, but also roll-to-roll large-area transfer, and can maintain the high quality of graphene after transfer, so that it is particularly suitable for the promotion and application of large-scale preparation and production.

BRIEF DESCRIPTION OF DRAWINGS

FIG. 1 is a schematic flow chart of the graphene film transfer process provided by the present disclosure.

DETAILED DESCRIPTION

In order to further understand the present disclosure, the preferred embodiments of the present disclosure are described below with reference to the examples, but it should be understood that these descriptions are only for further illustrating the features and advantages of the present disclosure, rather than limiting the claims of the present disclosure.

All the raw materials of the present disclosure are not particularly limited in their sources, which can be purchased in the market or prepared according to conventional methods well known to those skilled in the art.

All the raw materials of the present disclosure are not particularly limited in their purity, and the present disclosure preferably adopts analytical purity or the conventional purity of the reagents used in the field of graphene transfer.

The present disclosure provides a binding agent for graphene film transfer, comprising:

5-95 parts by weight of volatile organic solvent A;

95-5 parts by weight of volatile organic solvent B;

The volatile organic solvent A comprises one or more of halogenated hydrocarbon solvent, aromatic hydrocarbon solvent, aliphatic hydrocarbon solvent and alicyclic hydrocarbon solvent;

The volatile organic solvent B comprises one or more of alcohol solvent, ester solvent, ether solvent, ketone solvent, phenol and petroleum ether.

The present disclosure provides the binding agent for graphene film transfer. In other word, the present disclosure provides an application of a volatile organic solvent combination as a binding agent in the graphene film transfer process, wherein, the volatile organic solvent combination comprises 5-95 parts by weight of volatile organic solvent A and 95-5 parts by weight of volatile organic solvent B. Specifically, the binding agent is preferably a two-component binding agent.

In the present disclosure, the volatile organic solvent A is added in an amount of 5-95 parts by weight, preferably 25-75 parts by weight, and more preferably 45-55 parts by weight.

In the present disclosure, the volatile organic solvent B is added in an amount of 95-5 parts by weight, preferably 75-25 parts by weight, more preferably 55-45 parts by weight.

In the present disclosure, the volatile organic solvent A comprises one or more of halogenated hydrocarbon solvent, aromatic hydrocarbon solvent, aliphatic hydrocarbon solvent and alicyclic hydrocarbon solvent, preferably is halogenated hydrocarbon solvent, aromatic hydrocarbon solvent, aliphatic hydrocarbon solvent or alicyclic hydrocarbon solvent.

In the present disclosure, the volatile organic solvent B comprises one or more of alcohol solvent, ester solvent, ether solvent, ketone solvent, phenol and petroleum ether, preferably is alcohol solvent, ester solvent, ether solvent, ketone solvent, phenol or petroleum ether.

In the present disclosure, the volatile solvent preferably comprises organic solvent insoluble and/or slightly soluble in water, more preferably is organic solvent insoluble or slightly soluble in water.

In the present disclosure, the graphene preferably comprises a graphene layer or a graphene film.

In the present disclosure, specifically the transfer is preferably transferring the graphene film from a growth substrate to a target substrate.

In the present disclosure, during the transfer process, the binding agent is preferably located between the graphene film and the target substrate.

In the present disclosure, the growth substrate preferably comprises metal substrate.

In the present disclosure, a method of the growth preferably comprises a chemical vapor deposition method.

In the present disclosure, the transfer process preferably comprises a step of laminating the graphene film, the binding agent and the target substrate.

In the present disclosure, specifically the binding agent between the graphene film and the target substrate is preferably an organic solvent liquid film.

In the present disclosure, the metal substrate preferably comprises one or more of copper foil, nickel foil and copper-nickel alloy, more preferably is copper foil, nickel foil or copper-nickel alloy.

In the present disclosure, the target substrate preferably comprises one or more of plastic substrate, ordinary glass substrate, quartz substrate, silicon wafer substrate and metal substrate, more preferably is plastic substrate, ordinary glass substrate, quartz substrate, silicon wafer substrate or metal substrate.

In the present disclosure, the halogenated hydrocarbon solvent preferably comprises one or more of trichloromethane, trichloroethane, tetrachloroethane, tetrachloroethylene and pentachloroethane, more preferably is trichloromethane, trichloroethane, tetrachloroethane, tetrachloroethylene or pentachloroethane.

In the present disclosure, the aromatic hydrocarbon solvent preferably comprises one or more of benzene, toluene, xylene and ethylbenzene, more preferably is benzene, toluene, xylene or ethylbenzene.

In the present disclosure, the aliphatic hydrocarbon solvent preferably comprises pentane and/or hexane, more preferably is pentane or hexane.

In the present disclosure, the alicyclic hydrocarbon solvent preferably comprises one or more of cyclohexane, cyclohexanone and methylcyclohexane, more preferably is cyclohexane, cyclohexanone or methylcyclohexane.

In the present disclosure, the alcoholic solvent preferably comprises octanol and/or hexanol, more preferably is octanol or hexanol.

In the present disclosure, the ester solvent preferably comprises one or more of ethyl acetate, methyl acetate, dimethyl carbonate and butyl acetate, more preferably is ethyl acetate, methyl acetate, dimethyl carbonate ester or butyl acetate.

In the present disclosure, the ether solvent preferably comprises one or more of diethyl ether, n-propyl ether and anisole, more preferably a is diethyl ether, n-propyl ether or anisole.

In the present disclosure, the ketone solvent preferably comprises one or more of methyl isobutyl ketone, propiophenone and methyl ethyl ketone, more preferably is methyl isobutyl ketone, propiophenone or methyl ethyl ketone.

In the present disclosure, the volatile solvent has a boiling point of preferably 50-250° C., more preferably 90-210° C., and more preferably 130-180° C.

In the present disclosure, the volatile solvent preferably comprises one or more of tetrachloroethane, tetrachloroethylene, pentachloroethane, toluene, pentane, ethyl acetate, dimethyl carbonate, methyl isobutyl ketone, phenol and petroleum ether, more preferably tetrachloroethane, tetrachloroethylene, pentachloroethane, toluene, pentane, ethyl acetate, dimethyl carbonate, methyl isobutyl ketone, phenol or petroleum ether.

The present disclosure provides a method of transferring graphene film, comprising the following steps:

1) Growing graphene on a metal substrate to obtain a metal substrate/graphene structural material;

2) Placing a volatile organic solvent binding agent between the graphene surface in the metal substrate/graphene structural material obtained in the above step and a target substrate, and then laminating to obtain a metal substrate/graphene/liquid film/target substrate structural material;

The volatile organic solvent binding agent comprises the binding agents for graphene film transfer described in any one of the above technical solutions;

3) Placing the metal substrate/graphene/liquid film/target substrate structural material of the above step into an etching solution, and then etching and removing the metal substrate to obtain a graphene/liquid film/target substrate structure;

4) In one or more steps of the etching process, during the process of taking out from the etching solution, and after taking out from the etching solution, volatilizing the liquid film of the graphene/liquid film/target substrate structure obtained in the above step to obtain a graphene/target substrate structural material.

In the present disclosure, first graphene is grown on a metal substrate to obtain a metal substrate/graphene structural material.

In the present disclosure, then the volatile organic solvent binding agent is placed between the graphene surface in the metal substrate/graphene structural material obtained in the above step and a target substrate, and then they are laminated to obtain a metal substrate/graphene/liquid film/target substrate structural material;

The volatile organic solvent binding agent comprises the binding agents for graphene film transfer described in any one of the above technical solutions.

In the present disclosure, a method of the placing preferably comprises placing the graphene surface in the metal substrate/graphene structural material and the target substrate into a volatile solvent binding agent.

In the present disclosure, a method of the laminating preferably comprises roll lamination and/or plate lamination, more preferably is roll lamination or plate lamination.

In the present disclosure, a pressure of the laminating is preferably 0.01-1 Pa, more preferably 0.05-0.8 MPa, more preferably 0.1-0.6 MPa, and more preferably 0.3-0.4 MPa.

In the present disclosure, a laminating speed of the roll lamination is preferably 0.1-2 m/min, more preferably 0.5-1.6 m/min, and more preferably 0.9-1.2 m/min.

In the present disclosure, a duration of the laminating is preferably 1-5 s, more preferably 1.5-4.5 s, more preferably 2-4 s, and more preferably 2.5-3.5 s.

In the present disclosure, then the metal substrate/graphene/liquid film/target substrate structural material of the above step is placed into an etching solution, and then etched and removed of the metal substrate to obtain a graphene/liquid film/target substrate structure.

In the present disclosure, finally in one or more steps of the etching process, during the process of taking out from the etching solution, and after taking out from the etching solution, the liquid film of the graphene/liquid film/target substrate structure obtained in the above step is volatilized to obtain a graphene/target substrate structural material.

In the present disclosure, in order to complete and refine the overall transfer process, better ensure the stability of the properties and structure of the graphene film during the transfer process, and improve the operability and efficiency of the transfer process, the above-mentioned method of transferring graphene film can be specifically as following steps:

(1) Growing graphene on a corresponding metal substrate by chemical vapor deposition to obtain a metal substrate/graphene structure.

(2) Using the above-mentioned binding agent to attach the graphene surface in the metal substrate/graphene with a target substrate together by roll lamination or plate lamination, thereby forming a metal substrate/graphene/liquid film/target substrate structure.

(3) Placing the metal substrate/graphene/liquid film/target substrate structure into an etching solution, and removing the metal substrate to obtain a graphene/liquid film/target substrate structure.

(4) During the process of etching and taking out the graphene/liquid film/target substrate structure from the etching solution, the liquid film being volatilized rapidly to obtain a graphene/target substrate structure, cleaning and drying the same to obtain a clean graphene/target substrate structure.

Specifically, the metal substrate is a metal with graphene grown on the surface, which may be copper foil, nickel foil, copper-nickel alloy, etc.

Specifically, the target substrate is plastic substrate, ordinary glass substrate, quartz substrate, silicon wafer substrate, metal substrate, etc.

Specifically, the binding agent (liquid film) is a thin organic solvent liquid film distributed between the metal substrate/graphene and the target substrate after roll lamination or plate lamination. The organic solvent has a boiling point of 50-250° C., and a saturated vapor pressure over 133.32 Pa at room temperature.

The volatile organic solvent A of the present disclosure is a halogenated hydrocarbon solvent, an aromatic hydrocarbon solvent, an aliphatic hydrocarbon solvent or an alicyclic hydrocarbon solvent.

Specifically, the halogenated hydrocarbon is, for example, trichloromethane $CHCl_3$, trichloroethane $C_2H_3Cl_3$, tetrachloroethane $C_2H_2Cl_4$, tetrachloroethylene $C_2Cl_4$, pentachloroethane $C_2HCl_5$ and the like.

Specifically, the aromatic hydrocarbon is, for example, benzene $C_6H_6$, toluene $C_7H_8$, xylene $C_8H_{10}$, ethylbenzene $C_8H_{10}$ and the like.

Specifically, the aliphatic hydrocarbon is, for example, pentane $C_5H_{12}$, hexane $C_6H_{14}$ and the like.

Specifically, the alicyclic hydrocarbon is, for example, cyclohexane $C_6H_{12}$, cyclohexanone $C_6H_{10}O$, methylcyclohexane $C_7H_{14}$ and the like.

The volatile organic solvent B of the present disclosure is an alcohol solvent, an ester solvent, an ether solvent, a ketone solvent, phenol or petroleum ether.

Specifically, the alcohol is, for example, octanol $C_8H_{18}O$, hexanol $C_6H_{14}O$ and the like.

Specifically, the ester is, for example, ethyl acetate $C_4H_8O_2$, methyl acetate $C_3H_6O_2$, dimethyl carbonate $C_3H_6O_3$, butyl acetate $C_6H_{12}O_2$ and the like.

Specifically, the ether is, for example, diethyl ether $C_4H_{10}O$, n-propyl ether $C_6H_{14}O$, anisole $C_7H_8O$ and the like.

Specifically, the ketone is, for example, methyl isobutyl ketone $C_6H_{12}O$, propiophenone $C_9H_{10}O$, methyl ethyl ketone $C_4H_8O$ and the like.

Specifically, others are, for example, phenol $C_6H_6O$, petroleum ether and the like.

More specifically, the volatile organic solvent A may be tetrachloroethane $C_2H_2Cl_4$, tetrachloroethylene $C_2Cl_4$, pentachloroethane $C_2HCl_5$, toluene $C_7H_8$ or pentane $C_5H_{12}$. The volatile organic solvent B may be ethyl acetate $C_4H_8O_2$, dimethyl carbonate $C_3H_6O_3$, methyl isobutyl ketone $C_6H_{12}O$, phenol $C_6H_6O$, petroleum ether.

Referring to FIG. 1, FIG. 1 is a schematic flow chart of the graphene film transfer process provided by the present disclosure, wherein, 1-metal substrate, 2-graphene, 3-liquid film, 4-target substrate.

The above content of the present disclosure provides a binding agent for graphene film transfer and a transfer method of graphene film. The two-component binding agent with a specific composition provided by the present disclosure uses a volatile solvent insoluble or slightly soluble in aqueous solution as the binding agent, and the function of the binding agent is to form a liquid film between the metal substrate/graphene and the target substrate. Because of the capillary force, the liquid film is able to attach the metal substrate/graphene with the target substrate together, which ensures that the metal substrate/graphene and the target substrate do not separate during the etching process. After the metal substrate is etched by the etching solution, the liquid film will be volatilized after the transfer is completed. Because of the existence of intermolecular forces, the graphene is able to attach to the target substrate. The present disclosure, by adopting such specific combination insoluble or slightly soluble in aqueous solution, can ensure that in the aqueous etching solution, the metal substrate/graphene and target substrate will not be separated because the liquid film in the metal substrate/graphene/liquid film/target substrate structure is not dissolved in the solution. Furthermore, the binding agent is volatile. After the metal substrate is etched, due to the volatility of the binding agent, the graphene can be firmly attached to the target substrate by intermolecular force. It can be guaranteed that there is no residual glue between the graphene and the target substrate, which represents high light transmittance of graphene to the greatest extent.

The two-component organic solvent insoluble or slightly soluble in the aqueous solution provided by the present disclosure is used as a binding agent, so that the metal substrate/graphene will not be separated from the target substrate because the liquid film is not dissolved in the etching solution, which guarantees the integrity of the graphene film. Because of the volatility of the binding agent, after the metal substrate is completely etched, the binding agent can be completely volatilized, and the graphene is firmly attached to the target substrate through intermolecular forces. It can be ensured that there is no residual glue between the graphene and the target substrate, which represents the high light transmittance of graphene to the greatest extent. This graphene transfer method can be used for low-cost and non-destructive transfer of graphene to any target substrate, and in conjunction with the roll-to-roll growth process, large-scale preparation and production can be achieved, and meanwhile, the purpose of reducing the sheet resistance of graphene through multiple transfers of graphene can be achieved.

The present disclosure does not use a transition substrate, which greatly reduces the cost, and realizes low-cost transfer. Moreover, the binding agent can be completely volatilized, so the transferred graphene has no residual glue. The graphene is pure and pollution-free, so that high-quality graphene film can be obtained after the transfer of the graphene. The graphene film has high-quality characteristics such as high light transmittance, no damage, low sheet resistance, etc. Furthermore, high-quality multi-layer transfer can be achieved and the quality of multi-layer graphene can be guaranteed. Moreover, because only intermolecular force is required to achieve non-detachment, graphene can be transferred to any different target substrate, such as plastic substrate, ordinary glass substrate, quartz substrate, silicon wafer substrate, precious metal substrate, etc. In addition, the transfer method provided by the present disclosure has simple operation, good controllability and high repeatability, which can realize not only single-piece transfer, but also roll-to-roll large-area transfer, and can maintain the high quality of graphene after the transfer, so that it is particularly suitable for the promotion and application of large-scale preparation and production.

In order to further illustrate the present disclosure, the binding agent for graphene film transfer and the transfer method of graphene film provided by the present disclosure will be described in detail below with reference to the examples, but it should be understood that these examples are implemented on the premise of the technical solution of the present disclosure. The provided detailed implementations and specific operation process is only to further illustrate the features and advantages of the present disclosure, rather than to limit the claims of the present disclosure. The protection scope of the present disclosure is not limited to the following examples.

Example 1

1. Graphene was grown on the surface of nickel foil by a chemical vapor deposition method to obtain a nickel foil/graphene structure.
2. Using phenol $C_6H_6O$ and a mixed solution of phenol $C_6H_6O$ and cyclohexane $C_6H_{12}$ in a mass ratio of 7:3 as a binding agent respectively, the graphene surface in the nickel foil/graphene and a silicon wafer were laminated through a laminator to form a nickel foil/graphene/liquid film/silicon wafer structure.
3. The nickel foil/graphene/liquid film/silicon wafer was placed into an etching solution to remove the nickel foil, in which the liquid film was volatilized quickly after the etching was completed, to obtain a graphene/silicon wafer structure, which was finally cleaned and blown to dry to obtain a clean graphene/silicon wafer.

When phenol $C_6H_6O$ was used as the binding agent, the sheet resistance of the transferred graphene was 220Ω/□.

When phenol $C_6H_6O$ and cyclohexane $C_6H_{12}$ were used as the binding agent, the sheet resistance of the transferred graphene was $200\Omega/\square$.

Example 2

1. Graphene was grown on the surface of copper foil by a chemical vapor deposition method to obtain a copper foil/graphene structure.
2. Using a mixed solution of tetrachloroethane $C_2H_2C_{14}$ and ethyl acetate $C_4H_8O_2$ in a mass ratio of 9:1 as a binding agent, the graphene surface in the copper cure the photo-curing glue to form a copper foil/graphene/photo-curing glue/PET structure.
3. The copper foil/graphene/photo-curing glue/PET was placed in an etching solution to remove the copper foil and obtain graphene/photo-curing/PET.
4. The graphene/photo-curing glue/PET was taken out of the etching solution, washed and blown to dry to obtain clean graphene/photo-curing glue/PET. The sheet resistance of graphene was $210/\square$.

Referring to Table 1, Table 1 is a comparison of the performance data of the transferred graphene film provided by the examples and comparative example of the present disclosure.

TABLE 1

| Product name | Pure PET | Example 1 | Example 2 of single layer | Example 2 of double layers | Example 3 | Comparative example 1 |
|---|---|---|---|---|---|---|
| Light transmittance | 92.15 | — | 89.43 | 86.74 | 89.25 | 87.85 |
| Sheet resistance | — | $200\Omega/\square$ $220\Omega/\square$ Phenol alone | $180\Omega/\square$ | $100\Omega/\square$ | $190\Omega/\square$ | $210\Omega/\square$ | foil/graphene and PET were laminated through a laminator to form a copper foil/graphene/liquid film/PET structure.
3. The copper foil/graphene/liquid film/PET was placed into an etching solution to remove the copper foil, in which the liquid film was volatilized quickly after the etching was completed, to obtain a graphene/PET structure, which was finally cleaned and blown to dry to obtain a clean graphene/PET. The sheet resistance of graphene was 180K/Q.
4. The above steps were repeated by using the clean graphene/PET as the target substrate to obtain a multi-layer graphene/PET. The sheet resistance of double-layer graphene was $100\Omega/\square$, and the sheet resistance of three-layer graphene was $70\Omega/\square$.

Example 3

1. Graphene was grown on the surface of copper foil by a chemical vapor deposition method using a roll-to-roll graphene growth equipment to obtain a rolled copper foil/graphene structure.
2. A roll-to-roll transfer equipment was used to continuously roll-to-roll laminate the graphene surface in the rolled copper foil/graphene and PET by using a mixed solution of pentachloroethane $C_2HCl_5$ and methyl isobutyl ketone $C_6H_{12}O$ in a mass ratio of 8:2 as a binding agent. After the lamination, it was introduced to an etching tank and a cleaning tank to obtain a rolled clean graphene/PET. The sheet resistance of graphene was $190\Omega/\square$.

Comparative Example 1

1. Graphene was grown on the surface of copper foil by a chemical vapor deposition method to obtain a copper foil/graphene structure.
2. Photo-curing glue was used to laminate the graphene surface in copper foil/graphene and PET together by a laminator, and a UV photo-curing machine was used to A binding agent for graphene film transfer and a transfer method of graphene film provided by the present disclosure have been described in detail above. Specific examples are used herein to illustrate the principles and embodiments of the present disclosure. The description of the above embodiments is only used to help understand the method of the present disclosure and the core ideas thereof, including the best mode, and also to enable any person skilled in the art to practice the present disclosure, including making and using any device or system, and implementing any combined methods. It should be noted that for those of ordinary skill in the art, several improvements and modifications can also be made to the present disclosure without departing from the principle of the present disclosure, and these improvements and modifications also fall within the protection scope of the claims of the present disclosure. The patent protection scope of the present disclosure is defined by the claims, and may include other embodiments that those skilled in the art can think of Such other embodiments are intended to be within the scope of the claims if they have structure elements that do not differ from the literal language of the claims, or if they comprise equivalent structure elements with insubstantial differences from the literal language of the claims.

The invention claimed is:
1. A method of transferring graphene film, comprising the following steps:
1) growing graphene on a metal substrate to obtain a metal substrate/graphene structural material;
2) placing a volatile organic solvent binding agent between the graphene surface in the metal substrate/graphene structural material obtained in the above step and a target substrate, and then laminating to obtain a metal substrate/graphene/liquid film/target substrate structural material;
wherein the volatile organic solvent binding agent comprises a binding agent for graphene film transfer, which comprises:
5-95 parts by weight of volatile organic solvent A;
95-5 parts by weight of volatile organic solvent B;

the volatile organic solvent A comprises one or more of halogenated hydrocarbon solvent, aromatic hydrocarbon solvent, aliphatic hydrocarbon solvent and alicyclic hydrocarbon solvent;

the volatile organic solvent B comprises one or more of alcohol solvent, ester solvent, ether solvent, ketone solvent, phenol and petroleum ether;

3) placing the metal substrate/graphene/liquid film/target substrate structural material of the above step into an etching solution, and then etching and removing the metal substrate to obtain a graphene/liquid film/target substrate structure;

4) in one or more steps of the etching process, during the process of taking out from the etching solution, and after taking out from the etching solution, volatilizing the liquid film of the graphene/liquid film/target substrate structure obtained in the above step to obtain a graphene/target substrate structural material.

2. The transfer method according to claim 1, wherein a method of the placing comprises placing the graphene surface in the metal substrate/graphene structural material and the target substrate into a volatile solvent binding agent;

a method of the laminating comprises roll lamination and/or plate lamination.

3. The transfer method according to claim 2, wherein a pressure of the laminating is 0.01-1 MPa;

a laminating speed of the roll lamination is 0.1-2 m/min;

a duration of the laminating is 1-5 s.

* * * * *